United States Patent [19]
Weaver

[11] Patent Number: 4,926,130
[45] Date of Patent: May 15, 1990

[54] SYNCHRONOUS UP-CONVERSION DIRECT DIGITAL SYNTHESIZER
[75] Inventor: Lindsay A. Weaver, San Diego, Calif.
[73] Assignee: Qualcomm, Inc., San Diego, Calif.
[21] Appl. No.: 144,904
[22] Filed: Jan. 19, 1988
[51] Int. Cl.[5] .................. H03K 3/80; H03B 21/02
[52] U.S. Cl. ........................ 328/14; 328/16; 328/23; 328/25; 328/27; 328/36; 307/529; 331/38
[58] Field of Search .............. 326/14, 30, 15, 23, 326/16, 27, 158, 159, 160, 161, 25, 36; 307/529, 479; 331/37, 38, 42, 43

[56] References Cited

U.S. PATENT DOCUMENTS

| | | | |
|---|---|---|---|
| 3,633,017 | 1/1970 | Crooke | 235/156 |
| 3,654,450 | 4/1972 | Webb | 235/197 |
| 3,877,022 | 4/1975 | Lehman et al. | 340/347 |
| 3,882,403 | 5/1975 | Gerken | 328/14 |
| 3,999,129 | 12/1976 | Kasson | 325/42 |
| 4,011,438 | 3/1977 | Aufderheide et al. | 235/152 |
| 4,039,951 | 8/1977 | Bruce et al. | 325/38 |
| 4,105,949 | 8/1978 | Hardin | 331/38 |
| 4,134,072 | 1/1979 | Bolger | 328/14 |
| 4,185,247 | 1/1980 | Harrison, Jr. | 325/14 |
| 4,315,219 | 2/1982 | Rocheleau et al. | 328/14 |
| 4,328,554 | 5/1982 | mantione | 364/721 |
| 4,331,941 | 5/1982 | Kovalick et al. | 328/14 |
| 4,345,500 | 8/1982 | Alonso et al. | 84/1.01 |
| 4,346,477 | 8/1982 | Gordy | 455/257 |
| 4,410,954 | 10/1983 | Wheatley, III | 364/701 |
| 4,449,117 | 5/1984 | Fortescue | 340/346 |
| 4,454,486 | 6/1984 | Hassun et al. | 332/16 R |
| 4,475,220 | 10/1984 | Mattei et al. | 376/86 |
| 4,482,974 | 11/1984 | Kovalick | 364/607 |
| 4,484,296 | 11/1984 | Treise et al. | 364/607 |
| 4,486,846 | 12/1984 | McCallister et al. | 364/607 |
| 4,494,073 | 1/1985 | Sozgi | 328/14 |
| 4,506,228 | 3/1985 | Kammeyer | 329/107 |
| 4,512,035 | 4/1985 | Victor et al. | 455/165 |
| 4,603,304 | 7/1986 | Burns et al. | 331/2 |
| 4,646,032 | 2/1987 | Wheatley, III et al. | 331/78 |
| 4,652,832 | 3/1987 | Jasper | 328/14 |
| 4,659,999 | 4/1987 | Motoyama et al. | 331/2 |
| 4,682,122 | 7/1987 | Remy et al. | 331/38 |
| 4,682,123 | 7/1987 | Loper et al. | 455/110 |
| 4,700,390 | 10/1987 | Machida | 381/29 |
| 4,701,934 | 10/1987 | Jasper | 375/1 |
| 4,707,665 | 11/1987 | Nugent et al. | 328/16 |
| 4,727,506 | 2/1988 | Fling | 364/745 |
| 4,750,214 | 6/1988 | Hart et al. | 455/214 |

FOREIGN PATENT DOCUMENTS

| | | | |
|---|---|---|---|
| 82110621 | 4/1982 | European Pat. Off. | |
| 0077209 | 6/1980 | Japan | 331/38 |

OTHER PUBLICATIONS

C. E. Barlow—"Understanding Microwave Frequency Synthesizers", The Electronic Engineer—Nov., 1967—pp. 36–38, 331–38.
"Dither Signals and Their Effect on Quantization Noise", Leonard Schumann, *IEEE Transactions on Communication Technology*, Dec., 1964, pp. 162–165.

Primary Examiner—Stanley D. Miller
Assistant Examiner—Tai V. Duong
Attorney, Agent, or Firm—Brown, Martin, Haller & McClain

[57] ABSTRACT

A method and apparatus for generating high frequency signals, comprising generating a fundamental frequency signal over a predefined tuning range using a direct digital synthesizer with a digital to analog converter operating at a predetermined sampling frequency and mixing the fundamental frequency with a high frequency reference signal in a mixer connected to the converter and a reference source. The reference frequency signal is provided by the reference source at a high frequency which is a multiple of the digital to analog converter sampling frequency and is the difference between a desired high frequency output and the fundamental frequency. Where desired a low pass filter is disposed between the synthesizer and the mixer and a band pass filter is disposed between the mixer and any output elements. A divide by N element can be connected between the reference source and the digital to analog converter to provide a sampling clock signal for the converter. In addition, the reference source can operate at even higher frequencies and a divide by M element is disposed between the reference source and both the divide by N element and the mixer. This allows the reference to be used for additional up conversion mixing with low noise at higher multiples of the converter sampling frequency to achieve higher output frequencies.

12 Claims, 1 Drawing Sheet

SYNCHRONOUS UP-CONVERSION DIRECT DIGITAL SYNTHESIZER

BACKGROUND OF THE INVENTION

1. Field of the Invention

The present invention relates to high frequency signal sources and more particularly to a high frequency source having low spurious noise output. The invention further relates to a high frequency source wherein the output of a Digital-to-Analog stage of a direct digital synthesizer is mixed with a reference frequency that is a multiple of the Digital-to-Analog sampling rate.

2. Background of the Art

Highly adjustable or tunable frequency sources or drivers are required for many advanced communication systems which employ high frequency FM modulation to transfer high bit rate digital data. A variety of frequency synthesizers have been developed to meet this need as reference signal sources or oscillators in digital communication systems.

However, as newer communication systems are developed for serving larger numbers of users, frequency resolution and noise generation become increasingly significant problems. This is a result of the narrower band width channel restrictions imposed on such systems to accommodate additional users within given bandwidth allocations, which results in continually smaller separations between adjacent channels. Therefore, to properly maintain minimum interference and maximum isolation in this environment, reference or mixing frequencies for each channel must be resolved with increasingly high accuracy and resolution, and minimum noise.

Direct digital synthesizers are finding extensive use in advanced digital communication systems especially for generating variable reference frequencies required by frequency hopping and high volume, multi-channel, systems. Direct digital synthesizers offer relatively high frequency accuracy and resolution, efficient interface with digital control circuitry and logic, and provide high speed operation and low power consumption, all of which are a must in satellite and mobile communication systems.

Direct digital frequency synthesizers typically comprise a digital phase accumulator, a periodic wave function conversion element, in the form of Read Only Memory (ROM) devices, and a Digital-to Analog Converter (DAC). The phase accumulator is used for incrementing a phase angle which is applied at regular sampling intervals to the conversion element which converts accumulated phase angles to a sine function amplitude which is then converted into an analog signal. That is, the instantaneous amplitude at given points during the period of the sine function are computed as digital values from accumulated phase and then transferred to the digital-to-analog converter for conversion to an analog signal having the same frequency as the phase angle data.

When digital information, such as a sine amplitude, is converted to analog form, spurious noise is created due to a quantization effect. This well known effect for any digital to analog conversion process creates spurious noise on a periodic basis.

While direct digital synthesizers provide high accuracy, reproducible, frequency tuning across a wide range of frequencies they are generally restricted to lower frequencies. The output frequency is limited to ½ the sampling frequency and the phase increment generation and conversion cannot be sampled with accuracy and high resolution above about 40–60 MHz. Therefore, direct digital synthesizers provide a primary or fundamental frequency output tunable from as low as 0 Hz up to a maximum number on the order of 10–30 Mhz.

Unfortunately, this upper frequency limit is too low for modern communication systems which range from 100–200 MHz into the gigahertz (GHz) range for modern satellite transponders. Many communication systems, especially those still in the planning stages, require very high frequency sources operating at many gigahertz. Since this is well beyond the fundamental frequency of direct digital synthesizer designs, some form of up conversion is generally performed using other circuit elements.

To provide higher frequencies, the fundamental output frequency from the direct digital synthesizer is transferred into a signal mixer where it is mixed with a high frequency reference signal. This mixing generates a sum and difference between the two signals and the reference signal and the desired frequency signal is subsequently transferred from the mixer to other apparatus for use. Therefore, an independent direct digital synthesizer circuit or circuit module is connected to an independent reference source and mixer circuit for production of the final frequency desired. The reference is chosen to bring the direct digital synthesizer output frequency up to the frequency range of interest and the tunable direct digital synthesizer output acts as a fine tuning source for the reference. Therefore, both high frequency and accurate tuning would be obtained.

However, the output of direct digital synthesizers are known to have spurious noise or noise spurs at various frequencies adjacent to the desired primary output frequency due to the phase conversion process. Likewise any reference signal may also have noise components. During mixing these various noise components may add together and generate a variety of unwanted frequencies at significant power levels in the final output signal. Therefore, the resolution of the up-converter output is often poor. The more stringent resolution requirements imposed on advanced systems are not easily satisfied by this up-conversion process.

An alternative is to take advantage of the [Sin X]/X nature of the typical direct digital synthesizer output and use the higher order alias frequencies generated by the direct digital synthesizer. That is, higher frequency components are generated by the direct digital synthesizer and occur at various harmonic multiples of the direct digital synthesizer sample clock mixed with the fundamental output. It has been thought that a bandpass filter could be used to select these high frequency components for amplification by a broad band power amplifier and use for the final signal. However, noise spurs present at lower frequencies are also present at higher frequencies and gain in relative magnitude with respect to the desired output frequencies as the frequency increases. Extremely high resolution filtering is, therefore, needed to remove such noise, which is on the order of the same magnitude as the desired output and close in frequency. This type of filtering is not practical in commercial applications due to cost and high complexity.

What is needed is a simple and effective way of converting a high resolution, high accuracy, direct digital synthesizer output from low frequency to high to extremely high frequencies without adding noise or otherwise degrading the output with spurious noise and spectral spurs. It would also be helpful if this conversion can be accomplished in a very cost effective and low power consumption manner to aid in use in mobile or portable communication equipment.

SUMMARY

In view of the above problems in the art, one purpose of the present invention is to provide a low noise method of increasing the output frequency of a direct digital synthesizer to very high frequencies.

Another purpose of the present invention is to provide a tunable high frequency direct digital synthesizer source.

It is an advantage of the present invention that it provides a highly tunable and accurate, high and very high frequency source which is very cost effective and simple to manufacture.

These and other objects, purposes, and advantages are realized using a method and apparatus for generating high frequency signals, comprising generating a fundamental frequency signal over a predefined tuning range using a direct digital synthesizer having a digital to analog converter operating at a predetermined sampling frequency and mixing the fundamental frequency with a high frequency reference signal in a first mixer connected to the digital to analog converter. The reference frequency signal is provided by a reference source at high to extremely high frequencies which are a multiple of the digital to analog converter sampling frequency and represent the difference between a desired higher frequency output and the fundamental frequency.

In further aspects of the invention, a low pass filter is connected to and disposed between the digital-to-analog converter and the mixer. At the same time, a band pass filter is connected to and disposed between the mixer and any output elements. A divide by N element can be connected between the reference source and the digital to analog converter to provide a sampling clock signal for the converter. In addition, the reference source can further comprise a source generating even higher frequencies with a divide by M element disposed between the reference source and both the divide by N element and the first mixer so that additional low noise up-conversion mixing is accomplished at higher multiples of the converter sampling frequency to achieve higher output frequencies.

BRIEF DESCRIPTION OF THE DRAWINGS

The novel features of the present invention may be better understood from the accompanying description when taken in conjunction with the accompanying drawings in which like characters refer to like parts and in which.

DETAILED DESCRIPTION OF A PREFERRED EMBODIMENT

The present invention provides a method and apparatus for generating high to extremely high frequency signals or carrier waves from a lower frequency digital synthesizer output with very low noise. This is accomplished by selecting a reference frequency to mix with a fundamental direct digital synthesizer output frequency provided by a digital to analog conversion stage. The reference frequency is a multiple of a sampling clock used by the digital-to-analog converter.

Figure 1:
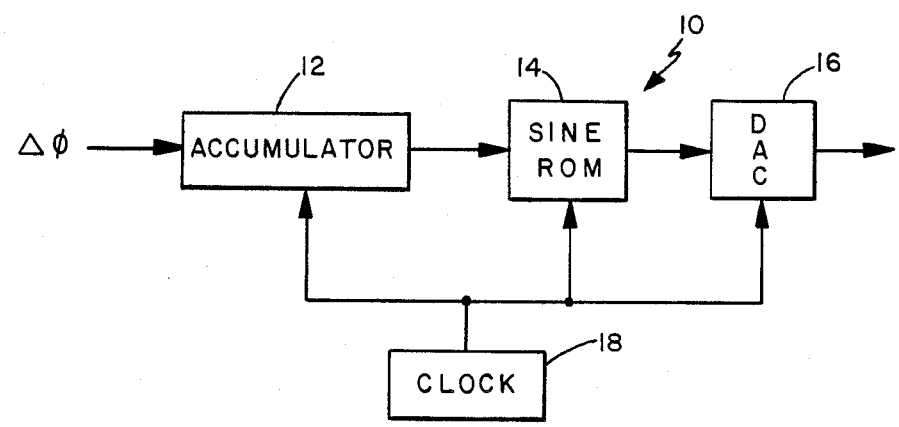
FIG. 1 illustrates a direct digital synthesizer using a digital to analog converter output stage.

A typical direct digital synthesizer circuit as known in the art of communications is illustrated in FIG. 1. In FIG. 1, a direct digital synthesizer type frequency synthesizer 10 is illustrated using a phase angle accumulator 12 for receiving, storing, and transferring phase angle information in the form of changes in a phase angle $\phi$. The phase angle information $d\phi$, is typically computed or provided as discrete increments of phase, by digital control circuitry such as, but not limited to, a microprocessor or preprogrammed memory element and represents relative phase changes for desired output frequencies. The preferred embodiment employs a microprocessor type controller to allow programmable flexibility and dynamic control over frequency changes.

The phase angle data is transferred into the accumulator 12 where it is accumulated to form digital (phase) values or words that are transferred into a periodic function converter 4. The phase angle information $d\phi$ is transferred along a data bus or path, to the periodic function converter 4 which generates a digital amplitude signal according to a mapping of the digital phase angle information onto a periodic function. Generally it is desired and known to employ a sine function for the conversion function of the converter 4 although other waveforms can be employed where desired. An exemplary function for this conversion is a sine amplitude output which is related to a phase input according to the relationship:

$$\sin(2\pi i/2^N)$$

where N is the number of bits in each data word transferred from the phase accumulator 12 and i is the current state of the accumulator.

The converter or sine converter 4 is configured to provide as perfect a sinusoidal output function as reasonable for the given circuit restraints (complexity, power, etc.). As discussed above, the sine amplitude converter 4 typically comprises one or more ROM devices which act as look-up tables for converting input phase information into output sine amplitude information. Those skilled in the art will readily appreciate that the teachings of the present invention are readily implemented using a variety of phase increment sources, accumulators, and function converters.

The amplitude output of the sine converter 4 is converted to analog form using a Digital-to-Analog Converter (DAC) 6 which is clocked at a predetermined sampling frequency or rate for the direct digital synthesizer 10. This produces the analog output signal for the direct digital synthesizer 10 which is used in a desired application. By changing the phase increment size, the output frequency will be changed and in this manner the frequency is tuned over a small range.

As discussed above, the direct digital synthesizer 10 cannot provide the desired high or extremely high frequencies desired without increasing spurious noise and unwanted frequency components. To provide tunable high frequency sources needed for such applications as advanced communications, the present invention uses a new up-conversion technique.

Figure 2:
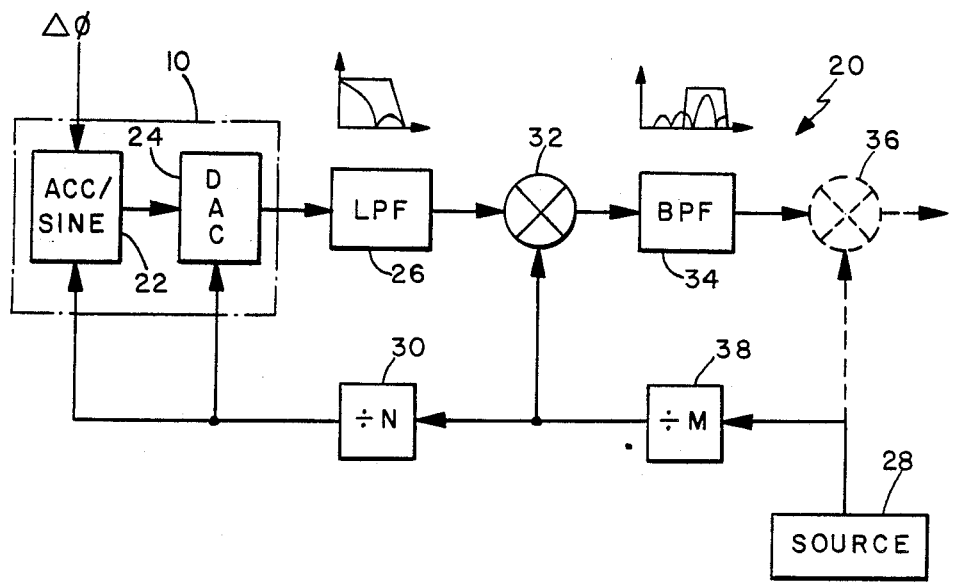
FIG. 2 illustrates a schematic of the high frequency source of the present invention.

A high frequency, low noise, tunable frequency generator or source, constructed and operating according to the principles of the present invention is illustrated in schematic form in FIG. 2. In FIG. 2, a synchronous direct digital synthesizer up-converter 20 is shown having an accum/sin ROM stage 22 which comprises the accumulator and sine conversion elements previously described with reference to FIG. 1. The output of the accum/sin stage 22 is applied to a digital to analog converter 24. These elements generate a tunable primary or fundamental frequency used for fine tuning the frequency generator 20.

For the up-conversion process only a specific fundamental output frequency is desired. To assure that a high resolution signal is used and to decrease noise spurs which are of sufficient magnitude to cause degradation of the final output signal, a Low Pass Filter (LPF) 26 is used on the digital-to-analog converter 24 output. The frequency response of the low pass filter 26 is chosen in accordance with the desired fundamental output. However, in some applications the LPF 26 may be omitted when the digital-to-analog converter 24 output is considered to have low enough noise.

In the present invention, the digital-to-analog converter sampling clock is provided by a reference frequency source 28. The frequency selected for the frequency source 28 depends on the application for the frequency generator 20 and whether additional high frequency mixing is to be performed, as described below. In the preferred embodiment, multiple mixing stages are used to achieve a very high frequency tunable output. Therefore, the frequency source 28 provides a signal at the frequency corresponding to the highest mixer input frequency required by the generator 20.

A frequency divider 30 is used to step the reference frequency down to a lower value and provide the clock signal needed for the digital-to-analog converter 24 and associated elements. The divider 30 is positioned on a signal line between the reference source 28 and the digital-to-analog converter 24 and provides a preselected divide by N operation. An exemplary reference source 28 provides an output at 60 MHz, an N value of 2, and the resulting digital-to-analog converter sample clock operates at 30 MHz. The output of the direct digital synthesizer stage of the generator 20 typically provides a fundamental frequency of 7-12 Mhz under these conditions.

The output of the digital-to-analog converter 24 is applied to one input of a mixer 32 and the reference signal is applied to a second input for the mixer 32. The output of the generator 20 would be 53-58 or 67-72 MHz for the above input values. The desired frequency is selected using low pass or band pass filtering.

It is often also desirable to employ a Band Pass Filter (BPF) 34 to remove noise that results from the mixer 32 operation.

In the generator 20 then, the sampling clock of the direct digital synthesizer stage and the reference source are synchronized and are provided as harmonics of each other which means that the spectrum of the output is unchanged from the direct digital synthesizer output and no new noise spurs are added nor are the existing ones enhanced. This is accomplished without providing multiple clock sources or complex filtering.

The output of the first mixer is generally still below the frequencies of interest for advanced communications and other applications. To achieve higher frequencies, as previously stated, the reference source 28 provides a higher frequency reference signal which is used in a second mixing stage 36. At the same time, this higher frequency signal is divided by a value M to obtain the first or intermediate mixing frequency. To accomplish this step, a divider 38 is disposed between the reference source 28 and both the mixer 32 and the divider 30. In the alternative, the divide by divider 38 is only disposed between the reference 28 and the mixer 32 while a divide by (N×M) element is disposed between the reference 28 and the digital-to-analog converter 24.

In the preferred embodiment, the reference source 28 provides a 180 MHz output signal with M=3 and N=2. The direct digital synthesizer is adjusted to provide a 7 MHz fundamental output which generates the 53 and 67 MHz signals previously referred to as well as a final output of 240±7 MHz and 120±7 MHz. The lower frequency range is typically removed by a bandpass filter applied to the output.

It is readily understood that the mixer 32 and 36 reference frequencies are always a multiple of the digital-to-analog converter sampling clock. The mixer 32 reference is N times the sample clock and the mixer 36 reference is (N×M) times the digital-to-analog converter sampling clock.

Therefore, what has been described is a new tunable high frequency source or generator which generates high frequency, tunable, signals with very low noise and complexity.

The foregoing description of preferred embodiments has been presented for purposes of illustration and description. It is not intended to be exhaustive nor to limit the invention to the precise form disclosed, and many modifications and variations are possible in light of the above teaching. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What I claim as my invention is:

1. An apparatus for generating high frequency signals, comprising:
   direct digital synthesizer means for generating a fundamental frequency signal over a predefined tuning range, said synthesizer having a digital to analog converter with a sample clock input and said converter operating at a sampling frequency determined by the frequency of an input sampling frequency signal provided at said sample clock input;
   a high frequency reference source providing a reference signal at a frequency of M, an odd integer, times N, an integer, times said sampling frequency;
   divide-by-M means connected to said high frequency reference source for, receiving said reference signal, dividing said reference signal in frequency by M and providing a first divided reference signal;
   divide-by-N means connected between said divide-by-M means and said converter sample clock input for, receiving said first divided reference signal, dividing said first divided reference signal in frequency and providing a second divided reference signal as said sampling frequency signal;
   first mixer means connected to an output of said synthesizer and said divide-by-M means for mixing said fundamental frequency signal and said first divided reference signal so as to generate an intermediate frequency output signal; and second mixer means connected to an output of said first mixer means and said high frequency reference source for mixing said intermediate frequency output signal and said reference signal so as to generate a desired high frequency signal.

2. The apparatus of claim 1 wherein said reference frequency has a value of about 180 MHz, M has a value of 3, and N has a value of 2.

3. The apparatus of claim 1 wherein M has a value of 3.

4. The apparatus of claim 3 wherein N has a value of 2.

5. A method for generating a high frequency signal, comprising the steps of:
   providing a first reference frequency signal having a frequency equal to a difference between a desired high frequency output signal and a fundamental frequency signal, and said first reference signal being at a frequency that is a multiple of M, an odd integer value, times N, an integer value, times a value corresponding to a frequency of a sampling frequency signal;
   dividing, in frequency, said first reference frequency signal by M to produce a second reference frequency signal;
   dividing, in frequency, said second reference frequency signal by N to produce said sampling frequency signal;
   providing said sampling frequency signal to a clock input of a digital to analog converter stage of a direct digital synthesizer;
   generating said predetermined fundamental frequency signal using said direct digital synthesizer which has said digital to analog converter stage operating at a sampling frequency of said sampling frequency signal;
   mixing said second reference frequency signal with said fundamental frequency signal to produce an intermediate output signal; and
   mixing said first reference frequency signal with said intermediate output signal to generate said high frequency signal output signal as an output.

6. The method of claim 5 further comprising the step of low pass filtering said fundamental frequency signal prior to mixing with said second reference frequency signal.

7. The method of claim 5 further comprising the step of bandpass filtering said high frequency output signal.

8. The method of claim 5 wherein M has a value of 3.

9. The method of claim 5 wherein N has a value of 2.

10. The method of claim 8 wherein N has a value of 2.

11. The method of claim 5 wherein said first reference frequency signal is of a frequency of about 180 MHz, and M has a value of about 3.

12. The method of claim 11 wherein N has a value of 2.

* * * * *